(12) United States Patent
Maalouf et al.

(10) Patent No.: US 11,742,809 B2
(45) Date of Patent: Aug. 29, 2023

(54) SYSTEMS AND METHODS FOR SENSING A CURRENT IN A CIRCUIT

(71) Applicant: c/o NXP USA, Inc., Austin, TX (US)

(72) Inventors: Elie A. Maalouf, Mesa, AZ (US); Xu Jason Ma, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 528 days.

(21) Appl. No.: 17/081,974

(22) Filed: Oct. 27, 2020

(65) Prior Publication Data

US 2022/0131507 A1   Apr. 28, 2022

(51) Int. Cl.
*H03F 3/24*   (2006.01)
*H03F 1/02*   (2006.01)

(52) U.S. Cl.
CPC .......... *H03F 3/245* (2013.01); *H03F 1/0288* (2013.01); *H03F 2200/462* (2013.01); *H03F 2200/504* (2013.01)

(58) Field of Classification Search
CPC .... G01R 31/36; G01R 27/04; G01R 19/0092; G01R 15/08; G01R 15/146; G01R 31/00; G01R 31/28; G01R 31/2834; G01R 31/2836; G01R 31/2879; H03F 1/0288; H03F 2200/462; H03F 2200/504; H03F 3/245
See application file for complete search history.

(56) References Cited

U.S. PATENT DOCUMENTS

| | | | |
|---|---|---|---|
| 4,553,052 A * | 11/1985 | Takahashi | H03K 17/16 327/91 |
| 6,167,242 A | 12/2000 | Henderson et al. | |
| 6,949,977 B2 * | 9/2005 | Macciocchi | H03F 3/087 330/207 P |
| 8,140,027 B2 * | 3/2012 | Ozgun | H04B 1/0458 455/127.1 |
| 10,141,892 B1 * | 11/2018 | Wu | H03F 3/19 |

OTHER PUBLICATIONS

Myoungbo et al. "High Efficiency Wideband Envelope Tracking Power Amplifier with Direct Current Sensing for LTE Applications", 2012 IEEE, 4 pgs.*

(Continued)

*Primary Examiner* — Vinh P Nguyen

(57) ABSTRACT

Embodiments of a device and method are disclosed. In an embodiment, a current sensing circuit includes first and second integrated resistors on a semiconductor die, a controllable current source configured to provide a reference current, and a current determination circuit. A resistance value of the second integrated resistor is a factor n larger than a resistance value of the first integrated resistor. A current drawn by a target circuit is configured to flow through the first integrated resistor, and the reference current is configured to flow through the second integrated resistor. The current determination circuit is configured to determine a value of the current drawn by the target circuit based on the value of the reference current when a first voltage at a terminal of the first integrated resistor is approximately equal to a second voltage at a terminal of the second integrated resistor.

20 Claims, 4 Drawing Sheets

(56) References Cited

OTHER PUBLICATIONS

Kumar Rajiv et al. "High Gain Low Power Low Noise Trans-impedance Amplifier for Current Sensing Application", 2017 IEEE, 4 pgs.*

Kwak, Myoungbo et al. "High Efficiency Wideband Envelope Tracking Power Amplifier with Direct Current Sensing for LTE Applications", 2012 IEEE, 4 pgs.

Ranjan, Kumar Rajiv et al. "High Gain Low Power Low Noise Trans-impedance Amplifier for Current Sensing Application", 2017 IEEE, 4 pgs.

* cited by examiner

SYSTEMS AND METHODS FOR SENSING A CURRENT IN A CIRCUIT

BACKGROUND

Power amplifiers, such as Doherty power amplifiers, may be used in 5G massive multiple input multiple output (mMIMO) active antenna systems (AAS). These active antenna systems (AAS) may employ large antenna arrays that may be realized on a single circuit board to support high speed and high bandwidth data rates. For example, a typical antenna array may include 64 antenna elements for transmission and another 64 antenna elements for reception. A power amplifier configured for such an antenna array may draw between 500 milliamps (mA) to 600 mA of current per antenna element during transmission or reception of data traffic, resulting in a total current draw of approximately 38 amps (A).

When a power amplifier is in a quiescent state (e.g., when the power amplifier is not receiving or transmitting data traffic), the power amplifier may need to be biased properly and repeatedly at an appropriate quiescent DC current level to ensure adequate linearity and efficiency. In some scenarios, if not properly biased, the power amplifier may consume a significant amount of power and may generate an excessive amount of heat. This may cause the power amplifier to malfunction and/or may compromise its reliability. As such, a device employing the power amplifier (e.g., base station) may require costly repairs and may suffer considerable downtimes.

To properly bias a power amplifier, the current draw in the power amplifier may need to be accurately sensed and monitored. This may enable appropriate adjustments to the bias levels for reliable and safe operation. However, typical approaches for sensing the current draw in a power amplifier involve the use of costly high tolerance external resistors suited for high power applications. Moreover, these external resistors may be bulky and may have a large footprint.

SUMMARY

Embodiments of a device and method are disclosed. In an embodiment, a current sensing circuit is disclosed. The current sensing circuit includes a first integrated resistor on a semiconductor die, wherein a first terminal of the first integrated resistor is coupled to a supply voltage input node and a second terminal of the first integrated resistor is coupled to a supply voltage output node, wherein the supply voltage output node is configured to provide at least a portion of a supply voltage to a target circuit, and wherein a current drawn by the target circuit is configured to flow through the first integrated resistor. The current sensing circuit further includes a controllable current source on the semiconductor die configured to provide a reference current.

The current sensing circuit further includes a second integrated resistor on the semiconductor die, wherein a resistance value of the second integrated resistor is a factor n larger than a resistance value of the first integrated resistor, wherein a first terminal of the second integrated resistor is coupled to the supply voltage input node and a second terminal of the second integrated resistor is coupled to the controllable current source, and wherein the reference current is configured to flow through the second integrated resistor.

The current sensing circuit further includes a current determination circuit on the semiconductor die coupled to the second terminal of the first integrated resistor, the second terminal of the second integrated resistor, and the controllable current source, the current determination circuit configured to control a value of the reference current based on a comparison of a first voltage at the second terminal of the first integrated resistor and a second voltage at the second terminal of the second integrated resistor, wherein the current determination circuit is configured to determine a value of the current drawn by the target circuit based on the value of the reference current when the first voltage is approximately equal to the second voltage.

In an embodiment, the current determination circuit is configured to generate a digital value that indicates the value of the current drawn by the target circuit.

In an embodiment, the current determination circuit is configured to determine the value of the reference current based on the supply voltage, the second voltage at the second terminal of the second integrated resistor, and the resistance value of the second integrated resistor, and to obtain a product of the value of the reference current and the factor n.

In an embodiment, the first integrated resistor and the second integrated resistor are a same type of integrated resistor.

In an embodiment, the target circuit is a power amplifier circuit comprising at least one transistor, and wherein the current drawn by the target circuit is a drain current of the at least one transistor.

In an embodiment, the resistance value of the first integrated resistor is within a range of 90 milliohms to 110 milliohms, and wherein the value of the factor n is within a range of 900 to 1100.

In an embodiment, the target circuit is fabricated on the semiconductor die.

In an embodiment, a power amplifier module is disclosed. The power amplifier module includes a power amplifier circuit on a substrate, the power amplifier circuit including at least one transistor. The power amplifier module further includes a current sensing circuit integrated on a semiconductor die, wherein the semiconductor die is mounted on the substrate.

The current sensing circuit includes a first integrated resistor, wherein a first terminal of the first integrated resistor is coupled to a supply voltage input node and a second terminal of the first integrated resistor is coupled to a drain terminal of the at least one transistor, wherein the second terminal of the first integrated resistor is configured to provide at least a portion of a supply voltage to the drain terminal of the at least one transistor, and wherein a drain current of the at least one transistor is configured to flow through the first integrated resistor. The current sensing circuit further includes a controllable current source configured to provide a reference current. The current sensing circuit further includes a second integrated resistor, wherein a resistance value of the second integrated resistor is a factor n larger than a resistance value of the first integrated resistor, wherein a first terminal of the second integrated resistor is coupled to the supply voltage input node and a second terminal of the second integrated resistor is coupled to the controllable current source, and wherein the reference current is configured to flow through the second integrated resistor. The current sensing circuit further includes a current determination circuit coupled to the second terminal of the first integrated resistor, the second terminal of the second integrated resistor, and the controllable current source, wherein the current determination circuit is configured to control a value of the reference current based on a comparison of a first voltage at the second terminal of the first integrated resistor and a second voltage at the second terminal of the second integrated resistor, and wherein the current determination circuit is configured to determine a value of the drain current of the at least one transistor based on the value of the reference current when the first voltage is approximately equal to the second voltage.

In an embodiment, the current determination circuit is further configured to generate a digital value that indicates the value of the drain current of the at least one transistor.

In an embodiment, the current determination circuit is further configured to determine the value of the reference current based on the supply voltage, the second voltage at the second terminal of the second integrated resistor, and the resistance value of the second integrated resistor, and to obtain a product of the value of the reference current and the factor n.

In an embodiment, the first integrated resistor and the second integrated resistor are a same type of integrated resistor.

In an embodiment, the power amplifier circuit is a Doherty power amplifier circuit.

In an embodiment, the resistance value of the first integrated resistor is within a range of 90 milliohms to 110 milliohms, and wherein a value of the factor n is within a range of 900 to 1100.

In an embodiment, a method for determining a current drawn by a target circuit involves flowing a current drawn by the target circuit through a first integrated resistor on a semiconductor die, wherein a first terminal of the first integrated resistor is coupled to a supply voltage and a second terminal of the first integrated resistor is coupled to the target circuit, and flowing a reference current through a second integrated resistor on the semiconductor die, wherein a resistance value of the second integrated resistor is a factor n larger than a resistance value of the first integrated resistor, and wherein a first terminal of the second integrated resistor is coupled to the supply voltage and a second terminal of the second integrated resistor is coupled to a controllable current source.

The method further involves comparing a first voltage at the second terminal of the first integrated resistor and a second voltage at the second terminal of the second integrated resistor, and determining a value of the current drawn by the target circuit based on the value of the reference current when the first voltage is approximately equal to the second voltage.

In an embodiment, the method further involves generating a digital value that indicates the value of the current drawn by the target circuit.

In an embodiment, the method further involves controlling the value of the reference current based on the comparison between the first voltage at the second terminal of the first integrated resistor and the second voltage at the second terminal of the second integrated resistor.

In an embodiment, determining the value of the current drawn by the target circuit comprises determining the value of the reference current based on the supply voltage, the second voltage at the second terminal of the second integrated resistor, and the resistance value of the second integrated resistor, and obtaining a product of the value of the reference current and the factor n.

In an embodiment, the first integrated resistor and the second integrated resistor are a same type of resistor.

In an embodiment, the target circuit is a power amplifier circuit comprising at least one transistor, and wherein the current drawn by the target circuit is a drain current of the at least one transistor.

In an embodiment, the resistance value of the first integrated resistor is within a range of 90 milliohms to 110 milliohms, and wherein a value of the factor n is within a range of 900 to 1100.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
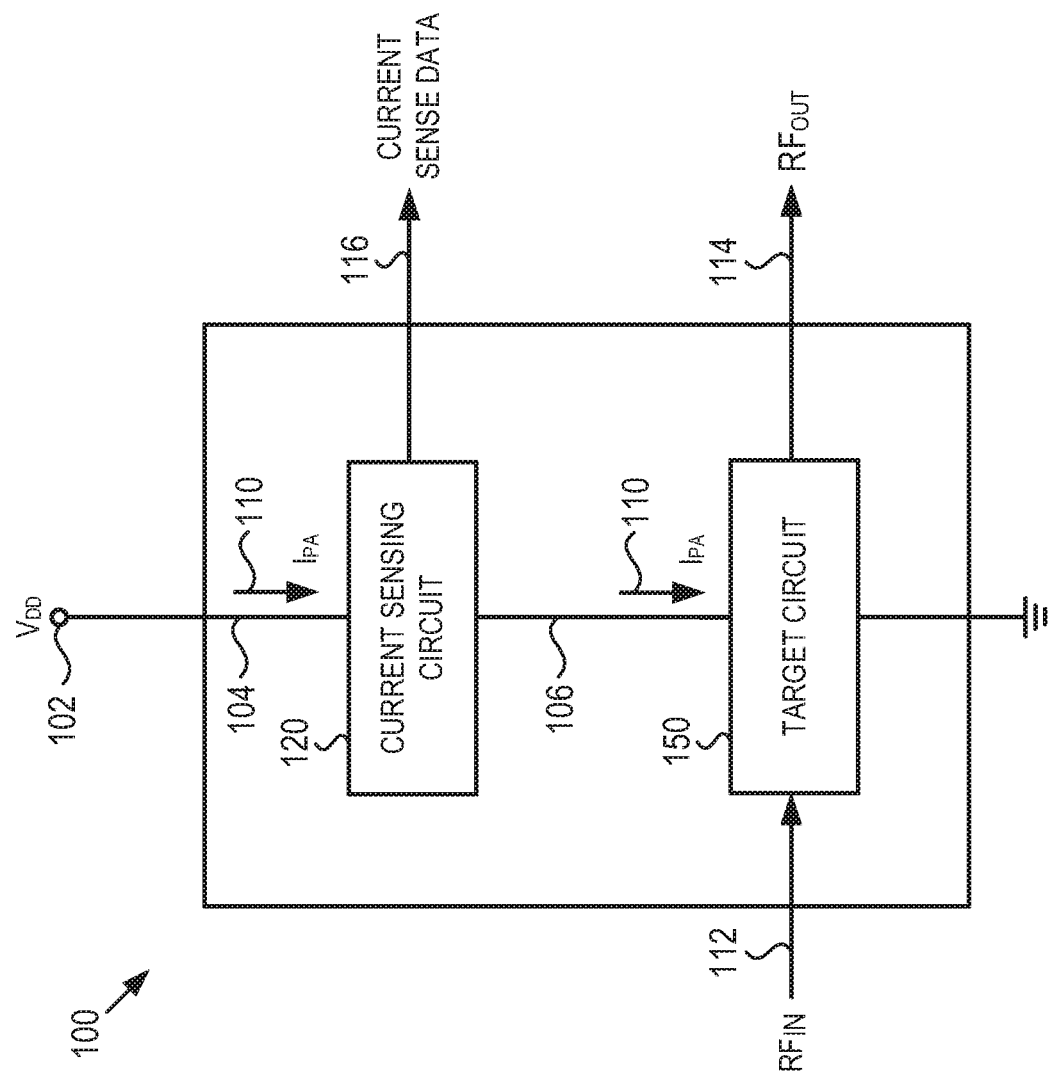
FIG. 1 depicts an exemplary block diagram of a module including a current sensing circuit and a target circuit in accordance with various embodiments of the present disclosure.

FIG. 1 depicts an exemplary block diagram of a module 100 including a current sensing circuit 120 and a target circuit 150 in accordance with various embodiments of the present disclosure. In some examples, the module 100 may be a power amplifier module and the target circuit 150 may be a power amplifier circuit that includes one or more transistors. In some examples, the current $I_{PA}$ 110 may represent the drain current of the one or more transistors in the power amplifier (PA) circuit. The drain current may be a quiescent DC current or a dynamic current. For example, the power amplifier circuit may be configured to receive a radio frequency (RF) input signal (e.g., $RF_{IN}$ 112) and to generate an amplified RF signal (e.g., $RF_{OUT}$ 114) for transmission in a wireless communication network (e.g., in a 5G network). In some examples, the target circuit 150 may be implemented as a Doherty amplifier circuit.

As shown in FIG. 1, the current sensing circuit 120 may be electrically coupled in series with the target circuit 150. The current sensing circuit 120 may be electrically coupled to a supply voltage ($V_{DD}$) 102 and may provide at least a portion of the supply voltage ($V_{DD}$) 102 to the target circuit 150 (e.g., via the conductive lines 104, 106). In some aspects of the disclosure, the current sensing circuit 120 may be fabricated on a semiconductor die included in the module 100. In other aspects of the disclosure, both the current sensing circuit 120 and the target circuit 150 may be fabricated on the same semiconductor die.

As described herein, the current sensing circuit 120 may determine a current $I_{PA}$ 110 drawn by the target circuit 150. In some examples, the dynamic range of the current $I_{PA}$ 110 may be within a range of 200 milliamps (mA) to 1000 mA. In some examples, the current sensing circuit 120 may generate current sense data 116 that indicates a value of the current $I_{PA}$ 110. For example, the current sensing circuit 120 may generate the current sense data 116 by converting a value of the current $I_{PA}$ 110 to a digital value. Accordingly, in some examples, the current sense data 116 may be in the form of an n-bit binary word.

Figure 2:
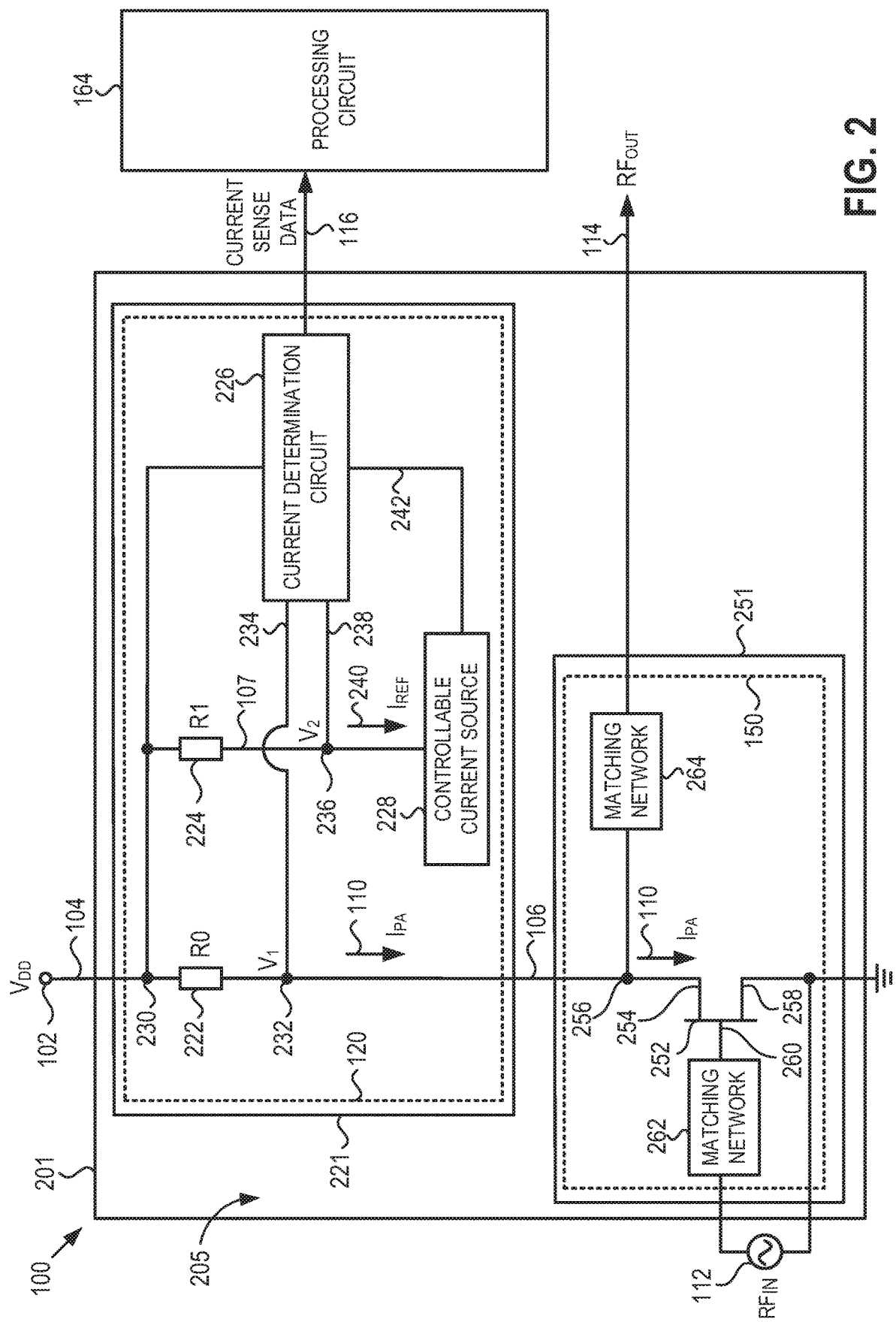
FIG. 2 depicts an exemplary implementation of the module including the current sensing circuit and the target circuit in accordance with various embodiments of the present disclosure.

FIG. 2 depicts an exemplary implementation of the module 100 including the current sensing circuit 120 and the target circuit 150 in accordance with various embodiments of the present disclosure. As shown in FIG. 2, the module 100 may include a substrate 201, a first semiconductor die 221, and a second semiconductor die 251. The first semiconductor die 221 and the second semiconductor die 251 may be mounted on a surface 205 of the substrate 201. The current sensing circuit 120 may be an integrated circuit fabricated on the first semiconductor die 221, and the target circuit 150 may be an amplifier circuit fabricated on the second semiconductor die 251.

With reference to FIG. 2, the current sensing circuit 120 may include a first integrated resistor (R0) 222, a second integrated resistor (R1) 224, a current determination circuit 226, and a controllable current source 228. The first integrated resistor (R0) 222 and the second integrated resistor (R1) 224 may be a same type of integrated resistor, such as a silicide resistor or a poly silicide resistor. Accordingly, the first integrated resistor (R0) 222 and the second integrated resistor (R1) 224 may have closely matched tolerances (e.g., tolerances of less than 1%).

A first terminal of the first integrated resistor (R0) 222 may be electrically coupled to a supply voltage input node 230, and a second terminal of the first integrated resistor (R0) 222 may be electrically coupled to a supply voltage output node 232. The supply voltage input node 230 may be coupled to the supply voltage ($V_{DD}$) 102. In some implementations, the supply voltage output node 232 may be electrically coupled to the target circuit 150. For example, the supply voltage output node 232 may be electrically coupled to a drain terminal (e.g., a drain terminal 254) of each transistor (e.g., a transistor 252) in the target circuit 150. The supply voltage output node 232 may be configured to provide at least a portion of the supply voltage ($V_{DD}$) 102 to the target circuit 150 (e.g., via the conductive line 104, the first integrated resistor (R0) 222, and the conductive line 106).

As further shown in FIG. 2, a first terminal of the second integrated resistor (R1) 224 may be electrically coupled to the supply voltage input node 230, and a second terminal of the second integrated resistor (R1) 224 may be electrically coupled to the controllable current source 228 via the conductive line 107.

The current determination circuit 226 may be electrically coupled to the second terminal of the first integrated resistor (R0) 222 (e.g., at node 232) via the conductive line 234, and may be electrically coupled to the second terminal of the second integrated resistor (R1) 224 (e.g., at node 236) via the conductive line 238. The current determination circuit 226 may be electrically coupled to the controllable current source 228 via the conductive line 242. As described in detail herein, the current determination circuit 226 may control the operation of the controllable current source 228 by transmitting control signals to the controllable current source 228 on the conductive line 242.

The target circuit 150 may include one or more transistors (e.g., the transistor 252 in FIG. 2) configured to amplify an input signal, such as an RF input signal (e.g., $RF_{IN}$ 112). In some configurations, the input signal (e.g., $RF_{IN}$ 112) may be provided to a gate terminal 260 of the transistor 252 through a matching network 262. The matching network 262 may include one or more passive or active components configured to perform impedance matching to maximize power transfer. In some configurations, an output signal (e.g., $RF_{OUT}$ 114) generated at the drain terminal 254 (e.g., at node 256) may be output through a matching network 264. The matching network 264 may include one or more passive or active components configured to perform impedance matching to maximize power transfer. As shown in FIG. 2, a source terminal 258 of the transistor 252 may be electrically coupled to ground.

In the example configuration of FIG. 2, the current $I_{PA}$ 110 drawn by the amplifier circuit (e.g., the target circuit 150) is configured to flow through the first integrated resistor (R0) 222. Therefore, the resistance value of the first resistor R0 222 may be relatively low to avoid a large voltage drop across the first resistor R0 222 and to reduce any impact to the operation and efficiency of the amplifier circuit (e.g., the target circuit 150). However, the resistance value of the first resistor R0 222 should be large enough to achieve accurate current sensing results. In some example implementations, the resistance value of the first integrated resistor (R0) 222 may be within a range of 90 milliohms to 110 milliohms.

The resistance value of the second integrated resistor (R1) 224 may be larger than the resistance value of the first integrated resistor (R0) 222 by a factor n (e.g., R1=(n)(R0)). In some example implementations, the value of the factor n may be a number within a range of 900 to 1100. Accordingly, in one example implementation, if the value of the factor n is set to 1000 and the resistance value of the first integrated resistor (R0) 222 is set to 100 milliohms, then the resistance value of the second integrated resistor (R1) 224 may be set to 100 ohms (e.g., R1=(1000)(100 milliohms) =100 ohms). In alternate implementations, n may be equal to or greater than 500, whereas in other alternate implementations, n may be equal to or greater than 700.

The controllable current source 228 may provide a reference current $I_{REF}$ 240 that flows through the second integrated resistor (R1) 224. The controllable current source 228 may receive a control signal from the current determination circuit 226 through the conductive line 242. The controllable current source 228 may set and/or change (e.g., increase or decrease) the value of the reference current $I_{REF}$ 240 based on the control signal. In some examples, the reference current $I_{REF}$ 240 may be within a range of 200 microamps to 1 milliamp.

The current determination circuit 226 may determine the value of the current $I_{PA}$ 110 drawn by the transistor 252 in the target circuit 150 based on a first voltage (e.g., $V_1$ at node 232) at the second terminal of the first integrated resistor (R0) 222, a second voltage (e.g., $V_2$ at node 236) at the second terminal of the second integrated resistor (R1) 224, and the value of the reference current $I_{REF}$ 240. For example, given that the resistance value of the second integrated resistor (R1) is n times greater than the resistance value of the first integrated resistor (R1) (e.g., R1=(n)(R0)), the voltage drop across the first integrated resistor (R0) 222 may be approximately equal to the voltage drop across the second integrated resistor (R1) 224 when the reference current $I_{REF}$ 240 is 1/nth of the value of the current $I_{PA}$ 110 (e.g., when $I_{REF}=(1/n)(I_{PA})$). As used herein, the term "approximately equal" means equal or within a range of ±5%. Accordingly, when the first voltage (e.g., $V_1$ at node 232) at the second terminal of the first integrated resistor (R0) 222 is approximately equal to the second voltage (e.g., $V_2$ at node 236) at the second terminal of the second integrated resistor (R1) 224, the reference current $I_{REF}$ 240 may be 1/nth of the value of the current $I_{PA}$ 110.

In some example implementations, when the amplifier circuit (e.g., the target circuit 150) is drawing the current $I_{PA}$ 110, the current determination circuit 226 may configure the controllable current source 228 to set the value of the reference current $I_{REF}$ 240 to a first value. The current determination circuit 226 may then compare the first voltage (e.g., $V_1$ at node 232) at the second terminal of the first integrated resistor (R0) 222 and the second voltage (e.g., $V_2$ at node 236) at the second terminal of the second integrated resistor (R1) 224. If the first voltage is approximately equal to the second voltage, the current determination circuit 226 may consider the first value of the reference current $I_{REF}$ 240 to be 1/nth of the value of the current $I_{PA}$ 110. The current determination circuit 226 may then obtain the value of the reference current $I_{REF}$ 240 by determining the voltage drop across the second integrated resistor (R1) 224 and dividing the voltage drop by the resistance value of the second integrated resistor (R1) 224. The current determination circuit 226 may then multiply the value of the reference current $I_{REF}$ 240 by the factor n to obtain the value of the current $I_{PA}$ 110.

In some embodiments, the current determination circuit 226 may include an analog-to-digital converter (ADC) circuit configured to convert the value of the current $I_{PA}$ 110 to a digital value (also referred to as current sense data). In some examples, the digital value (e.g., the current sense data 116) may be in the form of an n-bit binary word. The current determination circuit 226 may transmit the digital value to a processing circuit 164. In some implementations, the current determination circuit 226 may transmit the digital value through a digital communication interface, such as an Inter-Integrated Circuit (I2C) interface. The processing circuit 164 may be configured to convert the digital value back to the original value of the current $I_{PA}$ 110.

In the previously described example, if the current determination circuit 226 determines that the first voltage (e.g., $V_1$ at node 232) at the second terminal of the first integrated resistor (R0) 222 is not approximately equal to the second voltage (e.g., $V_2$ at node 236) at the second terminal of the second integrated resistor (R1) 224, the current determination circuit 226 may change (e.g., increase or decrease) the reference current $I_{REF}$ 240 based on whether the second voltage (e.g., $V_2$ at node 236) is higher or lower than the first voltage (e.g., $V_1$ at node 232). For example, the current determination circuit 226 may reduce the reference current $I_{REF}$ 240 if the first voltage is higher than the second voltage, or may increase the reference current $I_{REF}$ 240 if the first voltage is lower than the second voltage. The current determination circuit 226 may then compare the first voltage (e.g., $V_1$ at node 232) to the second voltage (e.g., $V_2$ at node 236) to determine whether the first voltage is approximately equal to the second voltage. In some examples, the current determination circuit 226 may continue to change the reference current $I_{REF}$ 240 and compare the first and second voltages as previously described until the first voltage is approximately equal to the second voltage.

In some examples, the current determination circuit 226 may include (or may have access to) a memory device, such as a static random-access memory (SRAM) device. In these examples, for each value of the reference current $I_{REF}$ 240, the current determination circuit 226 may store a value of the first voltage (e.g., $V_1$ at node 232), a value of the second voltage (e.g., $V_2$ at node 236), a value of the reference current $I_{REF}$ 240, a result of the comparison between the value of the first voltage and the value of the second voltage, and/or a digital value representing the value of the reference current $I_{REF}$ 240. In some embodiments, the current determination circuit 226 may include a level shifter circuit configured to increase the value of the first voltage and/or the value of the second voltage.

Figure 3:
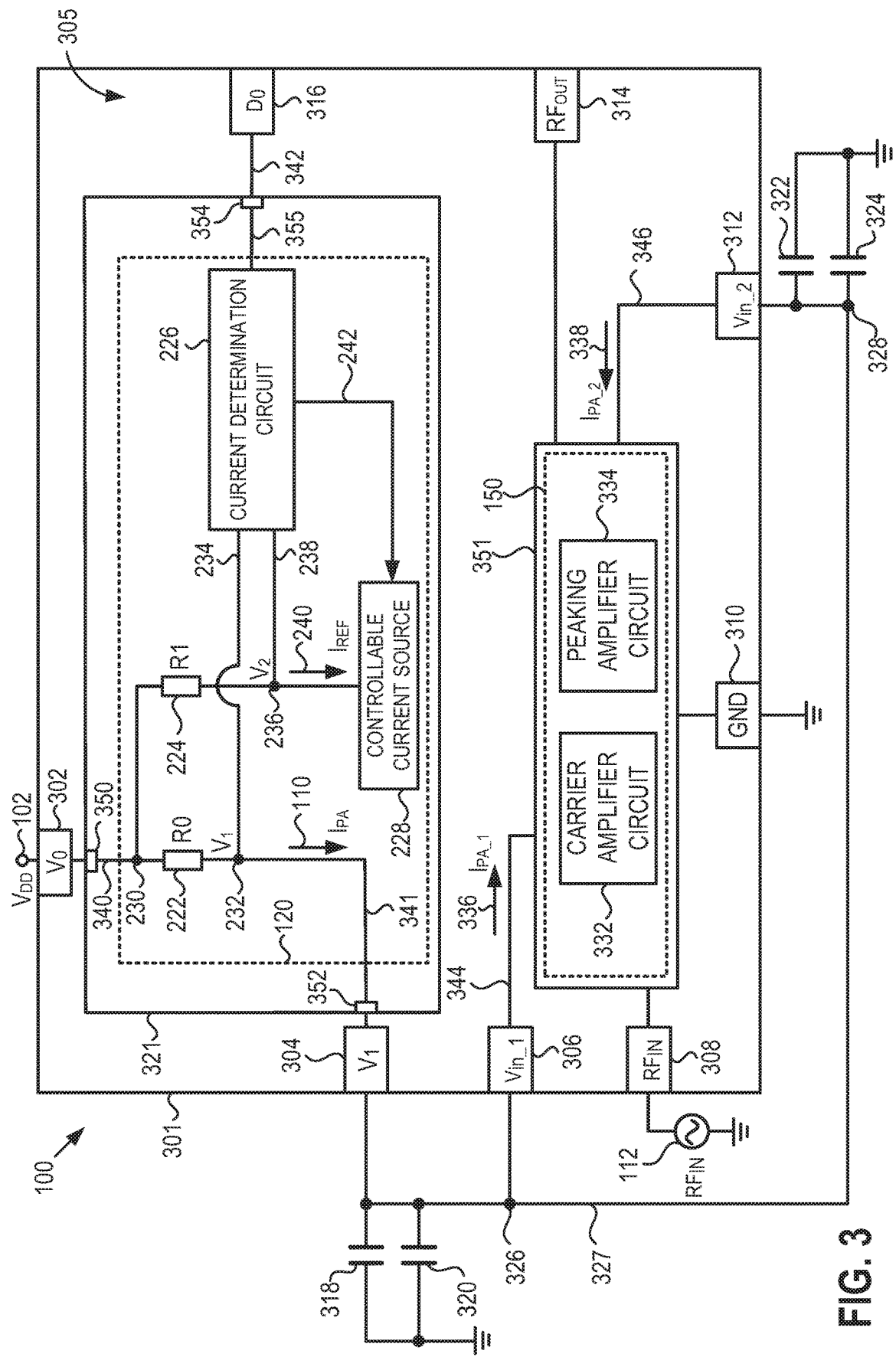
FIG. 3 depicts an exemplary implementation of the module including the current sensing circuit and the target circuit in accordance with various embodiments of the present disclosure.

FIG. 3 depicts an exemplary implementation of the module 100 including the current sensing circuit 120 and the target circuit 150 in accordance with various embodiments of the present disclosure. As shown in FIG. 3, the module 100 may include a substrate 301, a first semiconductor die 321, and a second semiconductor die 351. The first semiconductor die 321 and the second semiconductor die 351 may be mounted on a surface 305 of the substrate 301.

The current sensing circuit 120 may be an integrated circuit fabricated on the first semiconductor die 321, and the target circuit 150 may be an amplifier circuit fabricated on the second semiconductor die 351. The module 100 may include a supply voltage input terminal ($V_O$) 302, a supply voltage output terminal ($V_1$) 304, a first voltage input terminal ($V_{in\_1}$) 306, a second voltage input terminal ($V_{in\_2}$) 312, a signal input terminal ($RF_{IN}$) 308, a signal output terminal ($RF_{OUT}$) 314, a ground terminal (GND) 310, and a data terminal ($D_O$) 316.

As shown in FIG. 3, the first semiconductor die 321 may include a first interface 350, a second interface 352, and a third interface 354. For example, the first, second, and third interfaces 350, 352, 354 may be implemented as bond pads. The supply voltage input node 230 may be electrically coupled to the first interface 350 via the conductive line 340. The first interface 350 may be electrically coupled to the supply voltage input terminal ($V_O$) 302.

The supply voltage output node 232 may be electrically coupled to the second interface 352 via the conductive line 341. The second interface 352 may be electrically coupled to the supply voltage output terminal ($V_1$) 304. The supply voltage output terminal ($V_1$) 304 may be electrically coupled to the first voltage input terminal ($V_{in\_1}$) 306 and the second voltage input terminal ($V_{in\_2}$) 312 via the conductive line 327. In some implementations, a capacitive bypass filter network including one or more shunt capacitors (e.g., the shunt capacitors 318, 320, 322, and 324) may be electrically coupled to the conductive line 327. For example, the capacitive bypass filter network (e.g., the shunt capacitors 318, 320, 322, and 324) may reduce noise on the conductive line 327. The supply voltage input terminal ($V_O$) 302 may be electrically coupled to the supply voltage ($V_{DD}$) 102. In some examples, the supply voltage ($V_{DD}$) 102 may be within a range of 28V to 45V.

In the implementation of FIG. 3, the target circuit 150 may be a Doherty power amplifier circuit including a carrier amplifier circuit 332 and at least one peaking amplifier circuit 334. The target circuit 150 may be electrically coupled to the first voltage input terminal ($V_{in\_1}$) 306 via the conductive line 344 and to the second voltage input terminal ($V_{in\_2}$) 312 via the conductive line 346. In some examples, the first voltage input terminal ($V_{in\_1}$) 306 may be electrically coupled to the carrier amplifier circuit 332 and the second voltage input terminal ($V_{in\_2}$) 312 may be electrically coupled to the peaking amplifier circuit 334. As further shown in FIG. 3, the target circuit 150 may be electrically coupled to the signal input terminal ($RF_{IN}$) 308, the signal output terminal ($RF_{OUT}$) 314, and the ground terminal (GND) 310.

In FIG. 3, the value of the current $I_{PA}$ 110 flowing through the first integrated resistor (R0) 222 may represent the total current drawn by the carrier and peaking amplifier circuits 332, 334. For example, the first voltage input terminal ($V_{in\_1}$) 306 may be electrically coupled to the drain terminals of the transistors in the carrier amplifier circuit 332 and the first current $I_{PA\_1}$ 336 may represent a total of the drain currents of the transistors in the carrier amplifier circuit 332. The second voltage input terminal ($V_{in\_2}$) 312 may be electrically coupled to the drain terminals of the transistors in the peaking amplifier circuit 334 and the second current $I_{PA\_2}$ 338 may represent a total of the drain currents of the transistors in the peaking amplifier circuit 334. Therefore, the current $I_{PA}$ 110 flowing through the first integrated resistor (R0) 222 may be approximately equal to the sum of $I_{PA\_1}$ and $I_{PA\_2}$.

In one example, to determine a total current drawn by the carrier and peaking amplifier circuits 332, 334, the current sensing circuit 120 may determine the current $I_{PA}$ 110 flowing through the first integrated resistor (R0) 222 as previously described with reference to FIG. 2. In some example implementations, the current determination circuit 226 may be electrically coupled to the third interface 354 via the conductive line 355, and the data terminal ($D_O$) 316 may be electrically coupled to the third interface 354 via the conductive line 342. The current determination circuit 226 may output a digital value representing the value of the current $I_{PA}$ 110 to the data terminal ($D_O$) 316 via the conductive line 355, the third interface 354, and the conductive line 342.

The embodiments described herein may enable highly accurate and reliable sensing of a current being drawn by a circuit, such as power amplifier circuit. By employing integrated resistors on a semiconductor die (e.g., the first integrated resistor (R0) 222 and the second integrated resistor (R1) 224) to sense a current (e.g., the current $I_{PA}$ 110), the embodiments described herein avoid the need for costly high power external resistors typically used with conventional current sensing circuits. Moreover, the integrated resistors described herein may achieve a reduced footprint, considering the bulky physical characteristics of the previously mentioned high power external resistors and considering the wire routing area typically needed to implement these external resistors.

In addition, the previously described high power external resistor typically used with a conventional current sensing circuit may have a poorly controlled temperature coefficient that may not be co-related with the internal silicon on which the conventional current sensing circuit may reside. This may introduce measurement errors and may result in inaccurate and/or inconsistent current values. The integrated resistors (e.g., the first integrated resistor (R0) 222 and the second integrated resistor (R1) 224) described herein, however, may be integrated on the same die, may be of the same type (e.g., poly silicide), and may have closely matched tolerances. These features may provide intrinsic immunity to process and temperature variations, thereby increasing the current sensing accuracy relative to conventional current sensing circuit designs.

Figure 4:
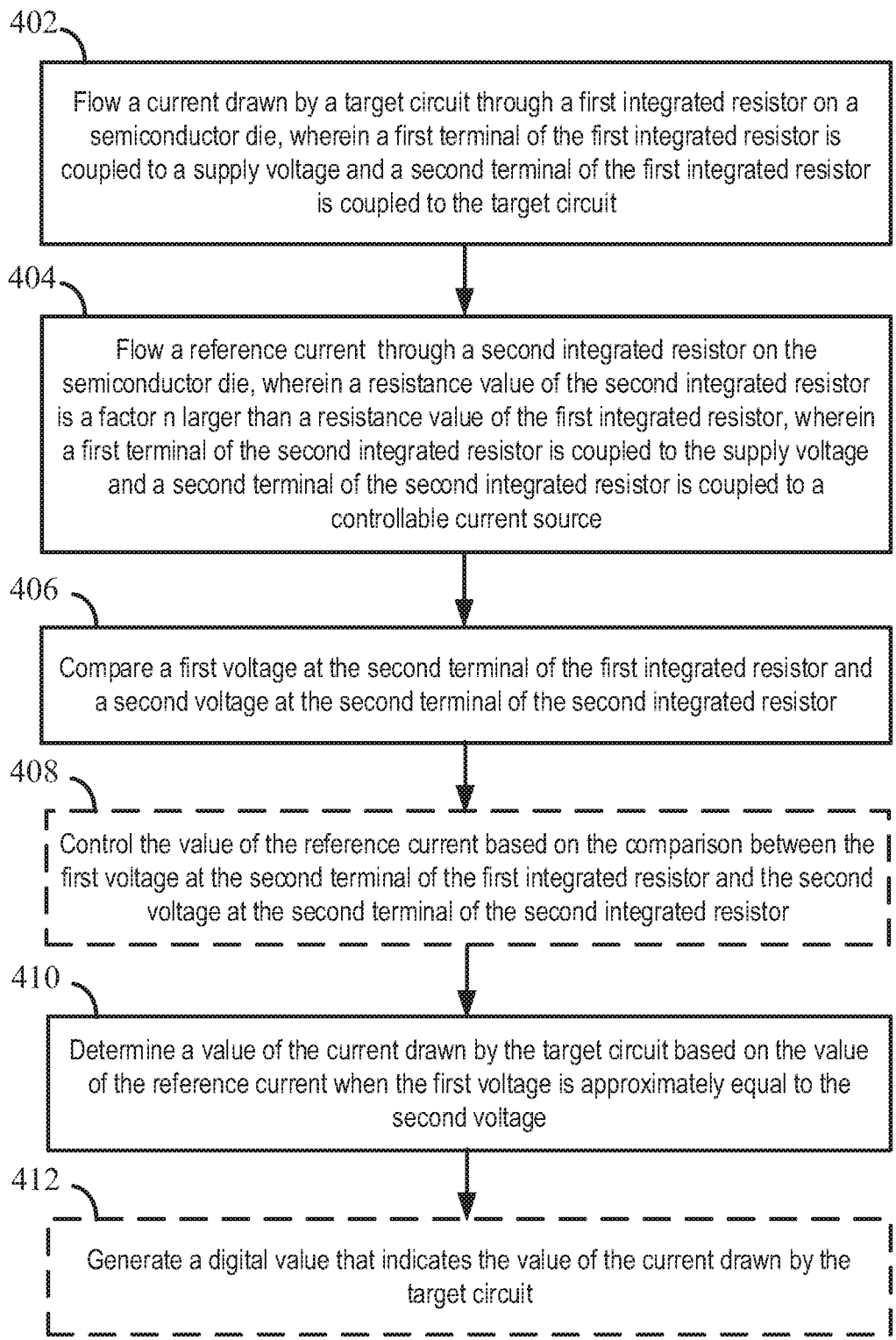
FIG. 4 is a flow diagram of a method for determining a current drawn by a target circuit in accordance with various embodiments of the disclosure.

FIG. 4 is a flow diagram of a method for determining a current drawn by a target circuit in accordance with various embodiments of the disclosure. For example, the method may be performed by the current sensing circuit 120. At block 402, the method involves flowing a current (e.g., the current $I_{PA}$ 110 in FIGS. 1-3) drawn by a target circuit (e.g., the target circuit 150 in FIGS. 1-3) through a first integrated resistor (e.g., the first integrated resistor (R0) 222 in FIGS. 2 and 3) on a semiconductor die. In some examples, the target circuit may be a power amplifier circuit. A first terminal of the first integrated resistor may be electrically coupled to a supply voltage (e.g., supply voltage ($V_{DD}$) 102) and a second terminal of the first integrated resistor may be electrically coupled to the target circuit. In some examples, when the target circuit is implemented as a power amplifier circuit, the target circuit may include at least one transistor (e.g., the transistor 252 in FIG. 2) and the current drawn by the target circuit is a drain current of the at least one transistor.

At block 404, the method involves flowing a reference current (e.g., the reference current $I_{REF}$ 240 in FIGS. 2 and 3) through a second integrated resistor (e.g., the second integrated resistor (R1) 224) on the semiconductor die. A resistance value of the second integrated resistor may be a factor n larger than a resistance value of the first integrated resistor. A first terminal of the second integrated resistor may be electrically coupled to the supply voltage and a second terminal of the second integrated resistor may be electrically coupled to a controllable current source (e.g., the controllable current source 228 in FIGS. 2 and 3). The first integrated resistor and the second integrated resistor may be a same type of integrated resistor, such as a silicide resistor or a poly silicide resistor.

At block 406, the method involves comparing a first voltage (e.g., the first voltage $V_1$ at node 232 in FIGS. 2 and 3) at the second terminal of the first integrated resistor and a second voltage (e.g., the second voltage $V_2$ 236 in FIGS. 2 and 3) at the second terminal of the second integrated resistor.

At block 408, the method involves controlling the value of the reference current based on the comparison between the first voltage at the second terminal of the first integrated resistor and the second voltage at the second terminal of the second integrated resistor. For example, the current determination circuit 226 may change (e.g., increase or decrease) the reference current $I_{REF}$ 240 based on whether the second voltage (e.g., $V_2$ at node 236) is higher or lower than the first voltage (e.g., $V_1$ at node 232). For example, the current determination circuit 226 may reduce the reference current $I_{REF}$ 240 if the first voltage is higher than the second voltage, or may increase the reference current $I_{REF}$ 240 if the first voltage is lower than the second voltage.

At block 410, the method involves determining a value of the current (e.g., the current $I_{PA}$ 110) drawn by the target circuit based on the value of the reference current when the first voltage is approximately equal to the second voltage. In some embodiments, the determination of the value of the current drawn by the target circuit may involve determining the value of the reference current based on the supply voltage, the second voltage at the second terminal of the second integrated resistor, and obtaining a product of the value of the reference current and the factor n.

For example, when the first voltage is approximately equal to the second voltage, the current determination circuit 226 may obtain the value of the reference current $I_{REF}$ 240 by determining the voltage drop across the second integrated resistor (R1) 224 and dividing the voltage drop by the resistance of the second integrated resistor (R1) 224. The current determination circuit 226 may then multiply the value of the reference current $I_{REF}$ 240 by the factor n to obtain the value of the current $I_{PA}$ 110. In some examples, the resistance value of the first integrated resistor may be within a range of 90 milliohms to 110 milliohms, and the value of the factor n may be within a range of 900 to 1100.

At block 412, the method involves generating a digital value that indicates the value of the current drawn by the target circuit. For example, the current sensing circuit 120 may generate the current sense data 116 by converting a value of the current $I_{PA}$ 110 to a digital value.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A current sensing circuit, comprising:
a first integrated resistor on a semiconductor die, wherein a first terminal of the first integrated resistor is coupled to a supply voltage input node and a second terminal of the first integrated resistor is coupled to a supply voltage output node, wherein the supply voltage output node is configured to provide at least a portion of a supply voltage to a target circuit, and wherein a current drawn by the target circuit is configured to flow through the first integrated resistor;
a controllable current source on the semiconductor die configured to provide a reference current;
a second integrated resistor on the semiconductor die, wherein a resistance value of the second integrated resistor is a factor n larger than a resistance value of the first integrated resistor, wherein a first terminal of the second integrated resistor is coupled to the supply voltage input node and a second terminal of the second integrated resistor is coupled to the controllable current source, and wherein the reference current is configured to flow through the second integrated resistor; and a current determination circuit on the semiconductor die coupled to the second terminal of the first integrated resistor, the second terminal of the second integrated resistor, and the controllable current source, the current determination circuit configured to control a value of the reference current based on a comparison of a first voltage at the second terminal of the first integrated resistor and a second voltage at the second terminal of the second integrated resistor, wherein the current determination circuit is configured to determine a value of the current drawn by the target circuit based on the value of the reference current when the first voltage is approximately equal to the second voltage.

2. The current sensing circuit of claim 1, wherein the current determination circuit is configured to generate a digital value that indicates the value of the current drawn by the target circuit.

3. The current sensing circuit of claim 1, wherein the current determination circuit is configured to:
determine the value of the reference current based on the supply voltage, the second voltage at the second terminal of the second integrated resistor, and the resistance value of the second integrated resistor; and
obtain a product of the value of the reference current and the factor n.

4. The current sensing circuit of claim 1, wherein the first integrated resistor and the second integrated resistor are a same type of integrated resistor.

5. The current sensing circuit of claim 1, wherein the target circuit is a power amplifier circuit comprising at least one transistor, and wherein the current drawn by the target circuit is a drain current of the at least one transistor.

6. The current sensing circuit of claim 1, wherein the resistance value of the first integrated resistor is within a range of 90 milliohms to 110 milliohms, and wherein the value of the factor n is within a range of 900 to 1100.

7. The current sensing circuit of claim 1, wherein the target circuit is fabricated on the semiconductor die.

8. A power amplifier module, comprising:
a power amplifier circuit on a substrate, the power amplifier circuit including at least one transistor;
a current sensing circuit integrated on a semiconductor die, wherein the semiconductor die is mounted on the substrate, the current sensing circuit including:
a first integrated resistor, wherein a first terminal of the first integrated resistor is coupled to a supply voltage input node and a second terminal of the first integrated resistor is coupled to a drain terminal of the at least one transistor, wherein the second terminal of the first integrated resistor is configured to provide at least a portion of a supply voltage to the drain terminal of the at least one transistor, and wherein a drain current of the at least one transistor is configured to flow through the first integrated resistor;
a controllable current source configured to provide a reference current;
a second integrated resistor, wherein a resistance value of the second integrated resistor is a factor n larger than a resistance value of the first integrated resistor, wherein a first terminal of the second integrated resistor is coupled to the supply voltage input node and a second terminal of the second integrated resistor is coupled to the controllable current source, and wherein the reference current is configured to flow through the second integrated resistor; and a current determination circuit coupled to the second terminal of the first integrated resistor, the second terminal of the second integrated resistor, and the controllable current source, wherein the current determination circuit is configured to control a value of the reference current based on a comparison of a first voltage at the second terminal of the first integrated resistor and a second voltage at the second terminal of the second integrated resistor, and wherein the current determination circuit is configured to determine a value of the drain current of the at least one transistor based on the value of the reference current when the first voltage is approximately equal to the second voltage.

9. The power amplifier module of claim 8, wherein the current determination circuit is further configured to generate a digital value that indicates the value of the drain current of the at least one transistor.

10. The power amplifier module of claim 8, wherein the current determination circuit is further configured to:
determine the value of the reference current based on the supply voltage, the second voltage at the second terminal of the second integrated resistor, and the resistance value of the second integrated resistor; and
obtain a product of the value of the reference current and the factor n.

11. The power amplifier module of claim 8, wherein the first integrated resistor and the second integrated resistor are a same type of integrated resistor.

12. The power amplifier module of claim 8, wherein the power amplifier circuit is a Doherty power amplifier circuit.

13. The power amplifier module of claim 8, wherein the resistance value of the first integrated resistor is within a range of 90 milliohms to 110 milliohms, and wherein a value of the factor n is within a range of 900 to 1100.

14. A method for determining a current drawn by a target circuit, comprising:
flowing the current drawn by the target circuit through a first integrated resistor on a semiconductor die, wherein a first terminal of the first integrated resistor is coupled to a supply voltage and a second terminal of the first integrated resistor is coupled to the target circuit;
flowing a reference current through a second integrated resistor on the semiconductor die, wherein a resistance value of the second integrated resistor is a factor n larger than a resistance value of the first integrated resistor, wherein a first terminal of the second integrated resistor is coupled to the supply voltage and a second terminal of the second integrated resistor is coupled to a controllable current source;
comparing a first voltage at the second terminal of the first integrated resistor and a second voltage at the second terminal of the second integrated resistor; and
determining a value of the current drawn by the target circuit based on the value of the reference current when the first voltage is approximately equal to the second voltage.

15. The method of claim 14, further comprising:
generating a digital value that indicates the value of the current drawn by the target circuit.

16. The method of claim 14, further comprising:
controlling the value of the reference current based on the comparison between the first voltage at the second terminal of the first integrated resistor and the second voltage at the second terminal of the second integrated resistor.

17. The method of claim 14, wherein determining the value of the current drawn by the target circuit comprises:
- determining the value of the reference current based on the supply voltage, the second voltage at the second terminal of the second integrated resistor, and the resistance value of the second integrated resistor; and
- obtaining a product of the value of the reference current and the factor n.

18. The method of claim 14, wherein the first integrated resistor and the second integrated resistor are a same type of resistor.

19. The method of claim 14, wherein the target circuit is a power amplifier circuit comprising at least one transistor, and wherein the current drawn by the target circuit is a drain current of the at least one transistor.

20. The method of claim 14, wherein the resistance value of the first integrated resistor is within a range of 90 milliohms to 110 milliohms, and wherein a value of the factor n is within a range of 900 to 1100.

\* \* \* \* \*